United States Patent
Han et al.

(10) Patent No.: US 6,552,374 B2
(45) Date of Patent: Apr. 22, 2003

(54) METHOD OF MANUFACTURING BIPOLAR DEVICE AND STRUCTURE THEREOF

(75) Inventors: Tae-Hyeon Han, Taejon (KR); Byung Ryul Ryum, Taejon (KR); Soo-Min Lee, Taejon (KR); Deok-Ho Cho, Taejon (KR)

(73) Assignee: ASB, Inc., Taejon (KR)

( * ) Notice: Subject to any disclaimer, the term of this patent is extended or adjusted under 35 U.S.C. 154(b) by 0 days.

(21) Appl. No.: 09/765,499

(22) Filed: Jan. 17, 2001

(65) Prior Publication Data

US 2002/0094654 A1 Jul. 18, 2002

(51) Int. Cl.[7] .......................................... H01L 31/072
(52) U.S. Cl. ........................................ 257/197; 438/309
(58) Field of Search ................................ 438/364–365, 438/323, 309, 207, 235, 311–312, 317–318, 320, 341, 348, 359, 362, 377, 369–370; 257/197–198, 192, 347, 511, 616, 555, 578, 591–593

(56) References Cited

U.S. PATENT DOCUMENTS

| 5,166,081 A | * | 11/1992 | Inada et al. | 437/31 |
| 5,444,014 A | * | 8/1995 | Ryum et al. | 437/62 |
| 5,484,737 A | * | 1/1996 | Ryun et al. | 437/31 |
| 5,496,745 A | * | 3/1996 | Ryum et al. | 437/31 |
| 5,599,723 A | * | 2/1997 | Sato | 437/31 |
| 5,672,522 A | * | 9/1997 | Streit et al. | 437/31 |
| 5,696,007 A | * | 12/1997 | Ryum et al. | 437/31 |
| 5,766,999 A | * | 6/1998 | Sato | 438/309 |
| 5,798,277 A | * | 8/1998 | Ryum et al. | 437/31 |
| 5,962,879 A | * | 10/1999 | Ryum et al. | 257/198 |
| 6,190,984 B1 | * | 2/2001 | Ryum et al. | 438/309 |
| 6,287,929 B1 | * | 9/2001 | Kato | 438/364 |
| 6,337,494 B1 | * | 1/2002 | Ryum et al. | 257/197 |

* cited by examiner

Primary Examiner—David Nelms
Assistant Examiner—David Vu
(74) Attorney, Agent, or Firm—Jacobson Holman PLLC

(57) ABSTRACT

Disclosed are a method for forming a base layer by epitaxial growth technology of a heterojunction bipolar device and a structure of the bipolar device manufactured by the method. The method comprises steps of depositing an insulation film containing silicon nitride on a substrate and removing a part of the insulation film to define a collector area; growing a first semiconductor in the collector area by selective epitaxial growth method to form the collector protruded over the insulation film in the form of a mushroom; forming an oxide film containing silicon dioxide on a surface of the collector protruded over the silicon nitride; selectively growing a second polycrystalline semiconductor material on only the nitride insulation film at the same height as the protruded portion of the collector to form a first base semiconductor electrode; removing an upper surface of the oxide film to expose the collector; and growing a second semiconductor containing silicon-germanium on the second polycrystalline semiconductor and the collector of the first semiconductor to form a second base semiconductor electrode on the first base semiconductor electrode and the base on the collector, thereby preventing a current leakage and a loading effect.

6 Claims, 4 Drawing Sheets

US 6,552,374 B2

METHOD OF MANUFACTURING BIPOLAR DEVICE AND STRUCTURE THEREOF

BACKGROUND OF THE INVENTION

1. Field of the Invention

The present invention relates to a method of manufacturing a silicon-germanium heterojunction bipolar transistor (SiGe HBT) and a structure thereof, and more particularly, to a method of forming a base layer including silicon-germanium by epitaxial growth and a structure of the SiGe HBT in a heterojunction bipolar transistor used as a high-speed device.

2. Description of the Related Art

Presently, due to continuous research and development in the field of electronics and telecommunications, optical transmission at a transmission rate of 10 Gbps or more is practicable using a high-speed device of 60 GHz class or more. In near future, it is expected that a 20~30 Gbps IC for the optical transmission will be developed using the high-speed device of 100 GHz and an optical transmission system of few hundred Gbps class will be commercialized. In the field of a mobile communication, a terminal is essentially required to be much smaller, lighter, and, as the same time, multi-functionalized with lower power consumption. Therefore, RF (radio frequency) components, which are large in their size, should be formed into an IC. By a development of hybrid IC technology and MMIC (monolithic microwave integrated circuit) technology, the RF components may be formed into the IC, and the quality of the terminal and system is improved.

As one of the silicon bipolar devices, the SiGe HBT in which silicon-germanium is used as a base layer has a high operating speed of 100 GHz or more, and is in the limelight as an advanced high-speed device. The SiGe HBT device employs almost all the existing silicon process as it is and forms the base layer having a thin thickness of 0.02 $\mu$m with the silicon-germanium using the epitaxial growth. Since the base layer (about 0.02 $\mu$m) is thinner than that of a conventional junction transistor and is formed by epitaxial growth using silicon-germanium having a smaller band gap than silicon, there is some advantage to obtain a high current gain and operating speed with lower power consumption.

A conventional method of manufacturing the SiGe HBT and structure thereof is as follows. FIG. 1 shows a cross-sectional view of a conventional heterojunction transistor defining a collector area by LOCOS (local oxidation of silicon) method.

Ion-implanting an n-type impurity in a p- type silicon substrate 1 forms a buried collector 11. Depositing n-type silicon on an entire surface of the substrate, in which the buried collector is formed, forms a collector thin film. On the collector thin film, an anti-oxidizing insulation film used as a mask covers a collector area and a collector sinker area. Then, the silicon exposed through the mask is oxidized by the LOCOS method to form a collector insulation film 17. Therefore, on a portion of the buried collector 11, the collector thin film except the active collector region and the collector sinker area is formed into the collector insulation film (field oxide film) 17 formed of silicon dioxide. An n-type impurity is implanted in the collector sinker area and then heat-treated at a high temperature to form a collector sinker 13. A silicon-germanium thin film for forming the base is grown on the entire surface of the substrate and is then patterned, except for the collector 15 and a portion of the collector insulation film 17 around the collector 15 so as to form a base thin film. Formed on the collector 15, is a single crystal base 25. The base 25 is extended laterally on the collector insulation film 17. The base 25 on the collector insulation film 17 is formed into a polycrystalline or amorphous base semiconductor electrode 23. On the entire surface, there is deposited silicon dioxide or silicon nitride to form an emitter insulation film 37. The emitter insulation film 37 is patterned so as to be opened a portion thereof corresponding to an active area of the base (25), thereby defining an emitter area. On the entire surface of the substrate, there is an emitter electrode 39 formed of a polycrystalline silicon containing the n-type impurity such as arsenic and phosphorus, and so forth. Then, the emitter semiconductor electrode 39 is heat-treated to diffuse the n-type impurity on the base thin film and thus form an emitter 35. The silicon dioxide or the silicon nitride is deposited on the entire surface of the substrate to form a protecting film 77. The protecting film 77 is patterned to form a contact window for exposing the emitter 35. Further, the protecting film 77 and the emitter insulation film 37 are patterned to form the contact windows for exposing the base semiconductor electrode 23 and the collector sinker 13. Finally, a metal layer is deposited and then patterned to form a base terminal 81 contacted through the contact window with the base semiconductor electrode 23, an emitter terminal 83 contacted through the contact window with the emitter 35 and a collector terminal contacted through the contact window with the collector sinker 13 (FIG. 1).

In the LOCOS method as described above, between the collector insulation film containing the silicon dioxide and the collector area containing the n-type impurity, a clean film is formed without any crystal defect. However, during the local oxidation of a part of the silicon layer, a bird's beak is formed at a side of the boundary surface. The protruding portion acts as an obstacle to scaling down the device. Further, when the silicon-germanium thin film grows on the substrate of the silicon dioxide film (collector insulation film) and the silicon (collector), there is a problem that the silicon-germanium thin film grows selectively on the silicon portion of the substrate.

In order to solve the problem, there is provided a selective epitaxial growth (SEG) method for manufacturing a high density and sub-micron heterojunction transistor. FIG. 2 shows a cross-sectional view of a structure of a SiGe HBT manufactured by the SEG method. The manufacturing method will be described more fully.

Ion-implanting an n-type impurity in a p- type silicon substrate 1 forms a buried collector 11. Formed on an entire surface of the substrate, on which the buried collector is formed, is a collector insulation film 17 of silicon dioxide. After defining a part of the collector insulation film 17, some portions of the collector insulation film 17 corresponding to a collector area and a collector sinker area are removed so as to expose a portion of the buried collector 11. A pattern shape of the removed collector insulation film 17 is formed to have a vertical sidewall. The collector area and the collector sinker area formed on a surface of the single crystal buried collector exposed through the removed portion of the collector insulation film 17 are filled with the single crystal silicon by the SEG method. At this time, the single crystal silicon excessively grows in the form of a mushroom to be higher than the collector insulation film 17. Then, a protruded portion of the grown single crystal silicon is removed by a chemical-mechanical polishing (CMP) method to flat the surface of the substrate. On the substrate on which a collector 15 and a collector sinker 13 are formed to have a vertical sidewall and a flat surface, silicon-germanium grows to form a base thin film. At this time, single crystal silicon-germanium grows on the single crystal silicon, i.e. the collector 15 to form a base 25 making a junction with the collector 15. Meanwhile, on the collector insulation film 17 formed of the silicon dioxide, polycrystalline or amorphous silicon-germanium grow. Formed on the base thin film is a base ohmic electrode layer 29 of a metal material in order to reduce a contact resistance. A portion of the base ohmic electrode layer 29 corresponding to the base 25 is removed to expose the base 25. And in order to prevent the base ohmic electrode layer 29 from being electrically contacted with an emitter to be formed, silicon dioxide or silicon nitride is deposited on the emitter insulation film 37. Then, the emitter insulation film 37, the base ohmic electrode layer 29 and the base thin film are patterned to define the base 25, the base semiconductor electrode 23 and the base ohmic electrode layer 29. At this time, the collector sinker 13 is exposed. Preferably, on outer sides of the emitter insulation film 37, the base ohmic electrode 29 and the base thin film etched by the patterning process, there is formed a sidewall insulation film 97. The emitter insulation film 37 is patterned so that a portion thereof corresponding to a center portion of the base 25 is removed to expose the base 25. Then, polycrystalline silicon containing an impurity is deposited and patterned to from an emitter semiconductor electrode 39 contacted with the exposed base 25 and a collector semiconductor electrode 19 contacted with the collector sinker 13. By a heat treatment process, the impurity in the emitter semiconductor electrode 39 is diffused to an upper portion of the base 25 to form an emitter 35. The silicon dioxide or the silicon nitride is deposed on the entire surface of the substrate to form a protecting film 77. The protecting film 77 is patterned to form a contact window for exposing the emitter semiconductor electrode 39. And, the protecting film 77 and the emitter insulation film 37 are patterned to form a contact window for exposing the base ohmic electrode 29. By sputtering a metal, there are formed a base terminal 81 contacted with the base ohmic electrode 29, an emitter terminal 83 contacted with the emitter semiconductor electrode 39 and a collector terminal 85 contacted with the collector semiconductor electrode.

In the conventional fabricating method described above, there is a problem in the selective epitaxial growth method for forming the collector 15 and the collector sinker 13. When the single crystal silicon grows in a well-shaped space having the vertical sidewall formed by the etching process, a boundary surface with the silicon dioxide sidewall has a very rough crystal structure. At the boundary surface between the collector 15 and the collector insulation film 17, there is formed a tunnel through which a carrier is freely passed. As a result, leakage current is generated from the base to the collector area, thereby lowering a quality of a device.

Further, when manufacturing the heterojunction bipolar device by the conventional method such as the LOCOS method and the epitaxial growth method, there is a problem with growth of the base thin film. The base thin film is formed on the collector and the collector insulation film by the epitaxial growth. On the surface of the substrate on which the crystal growth is performed, there are distributed mainly the silicon dioxide and intermittently the single crystal silicon area. In this situation, if the base thin film grows, it is difficult to form the silicon germanium thin film, which is uniform in thickness, germanium contents, and impurity concentration, due to loading effect. This is a prime cause that the operation speed of the bipolar and quality of the product are lowered.

SUMMARY OF THE INVENTION

Accordingly, it is an object of the present invention to provide a heterojunction transistor in which the problems inherent in the conventional transistor manufactured by the selective epitaxial growth method proper to reducing of a device size are solved, thereby providing a high operation speed and a high quality of a product, and a manufacturing method thereof.

It is other object of the present invention to provide a method of manufacturing a heterojunction bipolar device using the silicon-germanium as a base layer, which prevents a leakage current between the collector and the base by a defect at a boundary surface between the insulation film and the collector inherent in the selective epitaxial growth method, and a structure of the transistor fabricated by the method.

It is another object of the present invention to provide a fabricating method for reducing the loading effect generated when a semiconductor material containing the SiGe grows on a surface containing the silicon and the insulation film to form a base layer, and a structure of the transistor fabricated by the method.

It is yet another object of the present invention to provide a manufacturing method for forming a junction structure between the collector and the base by a self-aligning method and thus minimizing a junction parasitic capacitance therebetween, and a structure of a bipolar device manufactured by the method.

According to the present invention, there is provided a method of manufacturing a bipolar device, in which a collector, a base and an emitter are formed in order, comprising steps of: depositing an insulation film containing silicon nitride on a substrate and removing a part of the insulation film to define a collector area; growing a first semiconductor in the collector area by selective epitaxial growth method to form the collector protruded over the insulation film in the form of a mushroom; forming an oxide film containing silicon dioxide on a surface of the collector protruded over the silicon nitride; selectively growing a second polycrystalline semiconductor material on only the nitride insulation film at the same height as the protruded portion of the collector to form a first base semiconductor electrode; removing an upper surface of the oxide film to expose the collector; and growing a second semiconductor containing silicon-germanium on the second polycrystalline semiconductor and the collector of the first semiconductor to form a second base semiconductor electrode on the first base semiconductor electrode and the base on the collector.

According to the present invention, there is also provided a bipolar device, comprising: an insulation film having a collector area provided with a vertical sidewall; a collector filled in the collector area and protruded over silicon nitride on a surface of a substrate to be formed into a mushroom shape; an oxide film enclosing only a side portion of a protruded portion of the collector; a first base semiconductor electrode formed on the nitride insulation film at a thickness corresponding to a height of the oxide film; a base contacted on the collector; and a second base semiconductor electrode extended to a side portion of the base and formed on the first base semiconductor electrode.

DETAILED DESCRIPTION OF THE PREFERRED EMBODIMENTS

The objects, characteristics and advantages of the above-described invention will become more apparent by describing the preferred embodiments thereof with reference to the accompanying drawings.

FIGS. 3a to 3h are cross-sectional views showing a method of manufacturing a silicon-germanium heterojunction bipolar transistor according to the present invention.

Ion-implanting an n-type impurity such as arsenic or phosphorus in a p-type silicon substrate 101 forms a buried collector 111. On an entire surface of the substrate on which the buried collector 11 is formed, there is formed an insulation film 117 of silicon nitride (Si3N4).

Figure 1:
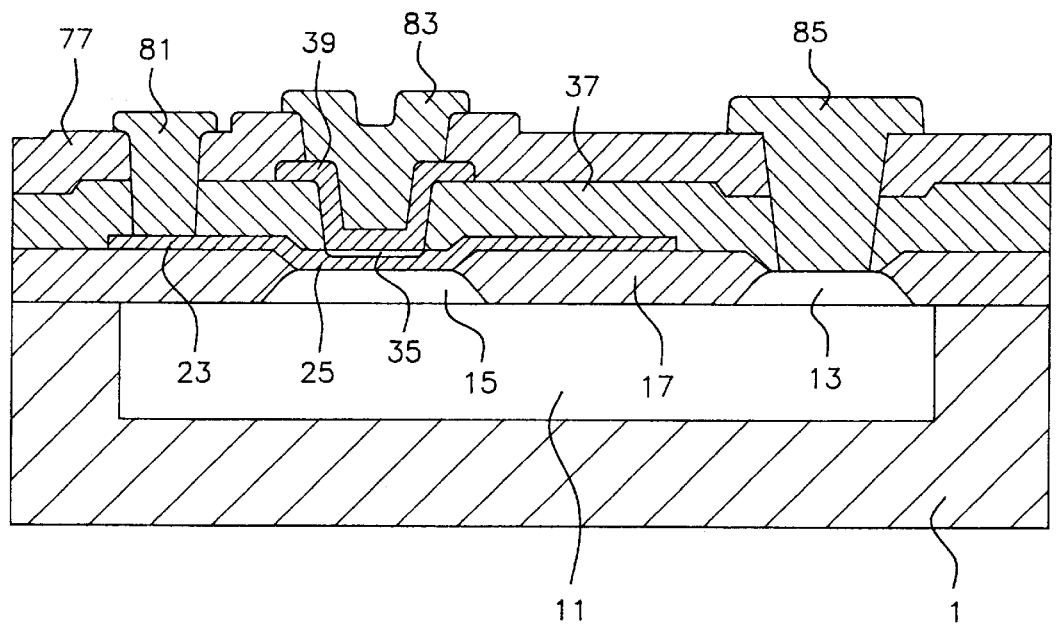
FIG. 1 is a cross-sectional view of a structure of a conventional silicon-germanium heterojunction bipolar transistor manufactured by LOCOS method.
Figure 2:
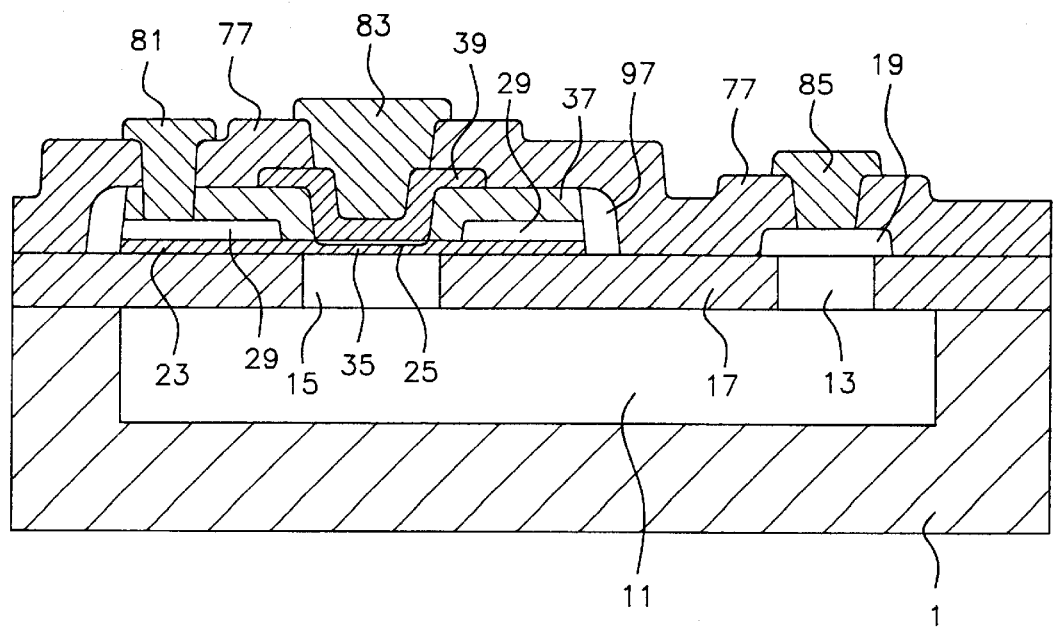
FIG. 2 is a cross-sectional view of another conventional silicon-germanium heterojunction bipolar transistor manufactured by SEG method.
Figure 3A:
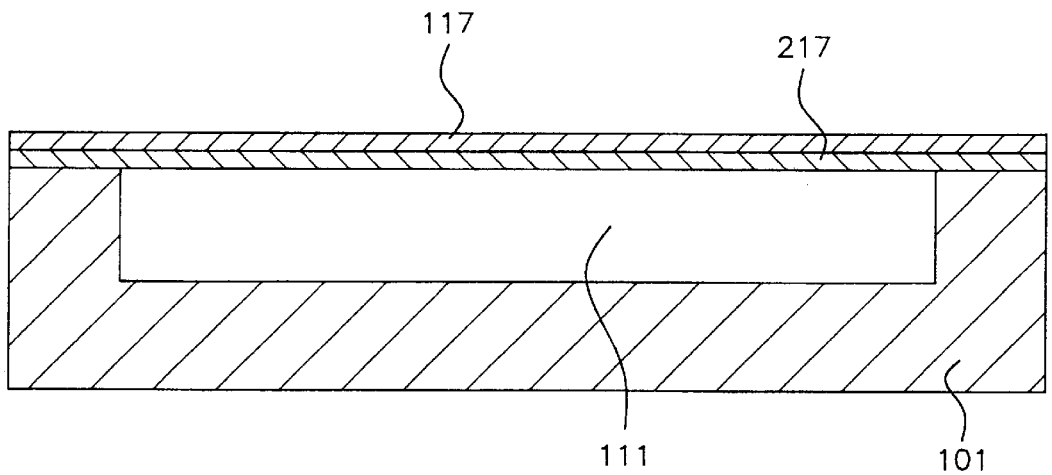
FIGS. 3a to 3i are cross-sectional views showing a method of manufacturing a silicon-germanium heterojunction bipolar transistor according to the present invention.

At this time, preferably, there is provided a further oxide insulation film 217 before forming the silicon nitride to form the insulation film 117 in which the oxide film and the nitride film are stacked (FIG. 3a).

Figure 3B:
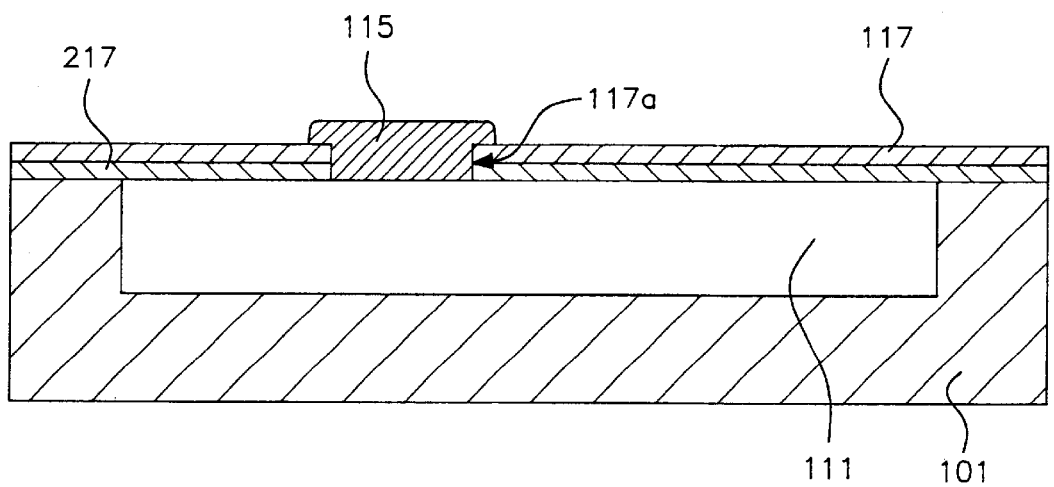

The insulation film 117 and 217 is patterned to form a collector area for exposing a part of the buried collector 111. The collector area is formed with a vertical type sidewall 117a. In the collector area, an intrinsic semiconductor containing p-type silicon grows by selective epitaxial growth (SEG) method. At this time, the intrinsic semiconductor excessively grows over the collector area to form a mushroom-shaped collector 115 protruded on the insulation film (FIG. 3b).

Figure 3C:
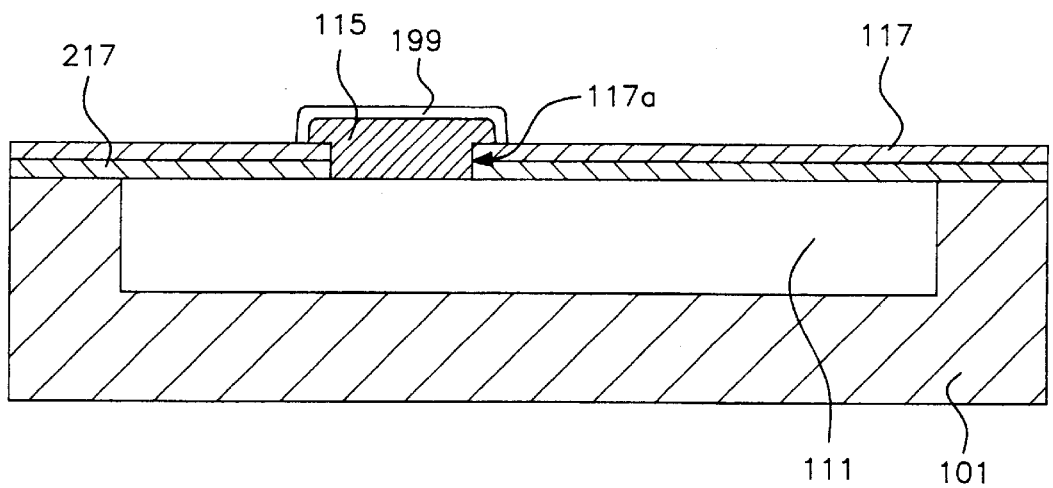

A heat treatment process oxidizes an upper surface of the protruded collector 115 to form an oxide film 199 of silicon dioxide. Therefore, only the insulation film 117 of the silicon nitride and the oxide film 199 of the silicon dioxide covering the collector 115 are exposed on the surface of the substrate (FIG. 3c).

Figure 3D:
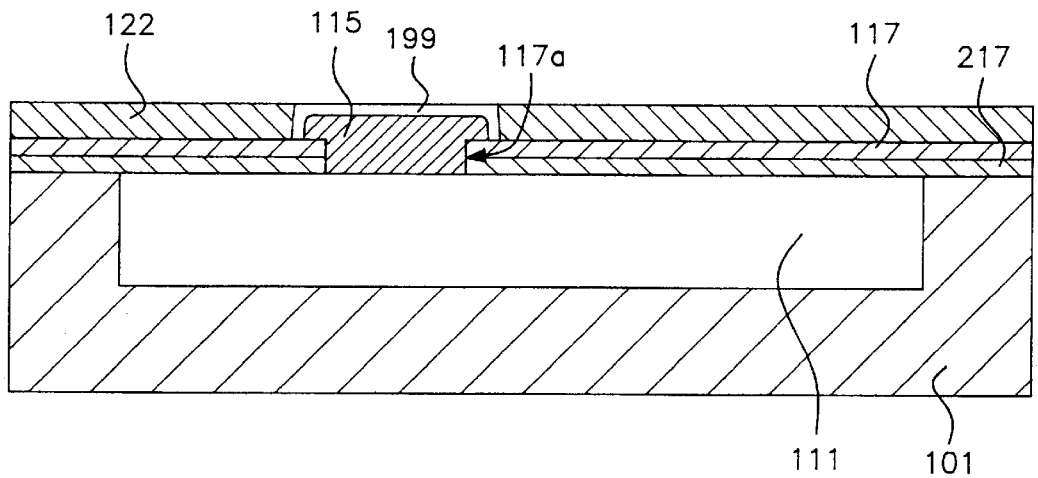

Out of the surfaces of the substrate comprised of the insulation film 117 of the silicon nitride and the oxide film 199 of the silicon dioxide, polycrystalline silicon grows selectively on the insulation film 117 of the silicon nitride by SEG method to form a buffer layer 122. In fact, there is a difference in growth selectivity of the silicon when it is grown on silicon nitride and silicon dioxide during the SEG process. Therefore, on the surface of the substrate, there are distributed mainly the polycrystalline silicon and intermittently the silicon dioxide (FIG. 3d).

Figure 3E:
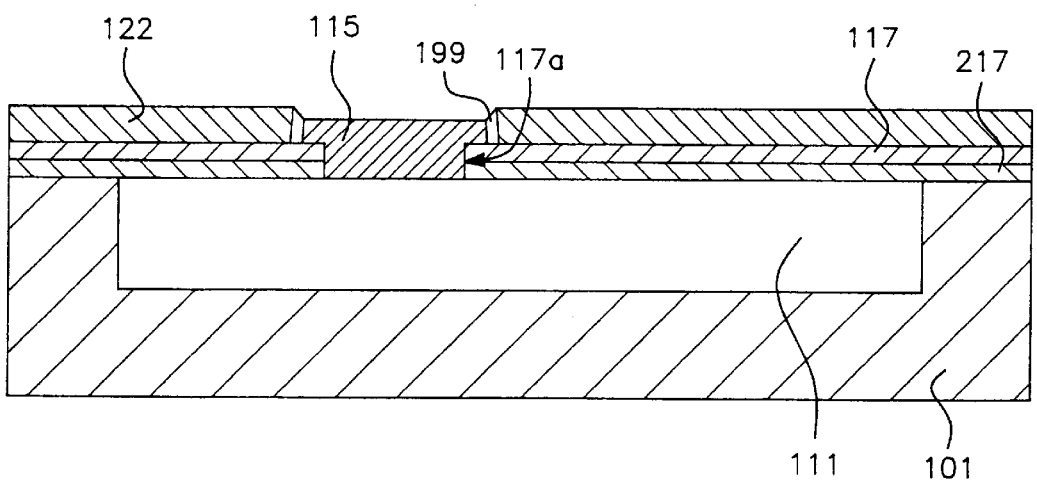

Only the silicon dioxide is removed from the surface of the substrate covered by the polycrystalline silicon and the silicon dioxide so that an upper surface of the mushroom-shaped collector 115 is exposed and a side thereof is enclosed by the oxide film 199. Therefore, on the surface of the substrate, there are distributed mainly the polycrystalline silicon and intermittently the single crystalline intrinsic semiconductor. And also, a minimal portion of the oxide film 199 is exposed on the surface of the substrate (FIG. 3e).

Figure 3F:
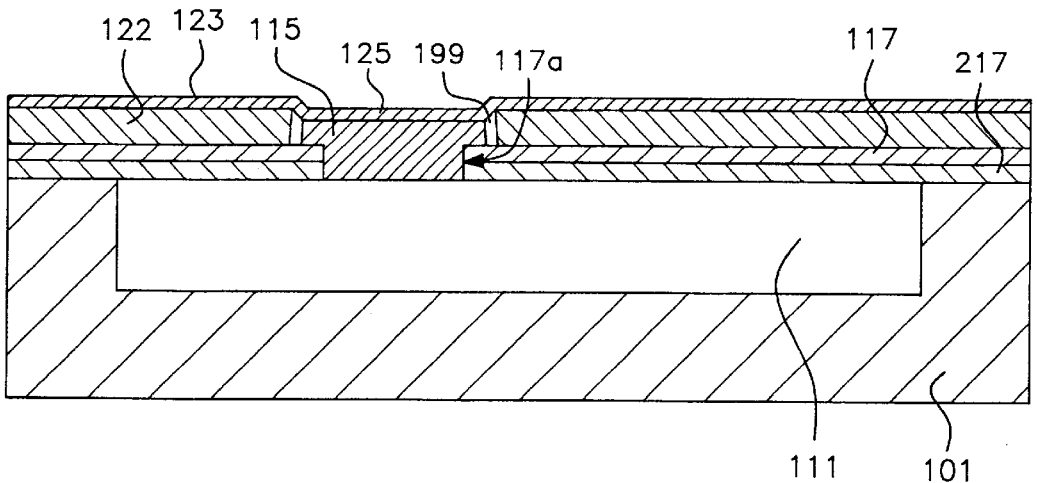

On the entire surface of the substrate mostly covered with the silicon, a semiconductor material containing silicon-germanium grows by epitaxial growth method to form a base layer. Since the base layer on the silicon grows under the same circumstances, the base layer is not influenced by loading effect and formed to have a uniform thickness over the entire surface of the substrate. In addition, polycrystalline SiGe grows on the buffer layer 122 formed of the polycrystalline silicon to form a base electrode layer 123. On the upper portion of the collector 115 enclosed by the oxide film 199, the single crystal SiGe grows to form a intrinsic base 125. A junction between the collector 115 and the base 125 is defined not by a pattern using a mask but by the oxide film 199 so as to be self-aligned. Therefore, since there is not absolutely formed an overlapped area interposing the insulation film between the collector 115 and the base 125 in the junction structure therebetween, junction parasitic capacitance is prevented (FIG. 3f).

Figure 3G:
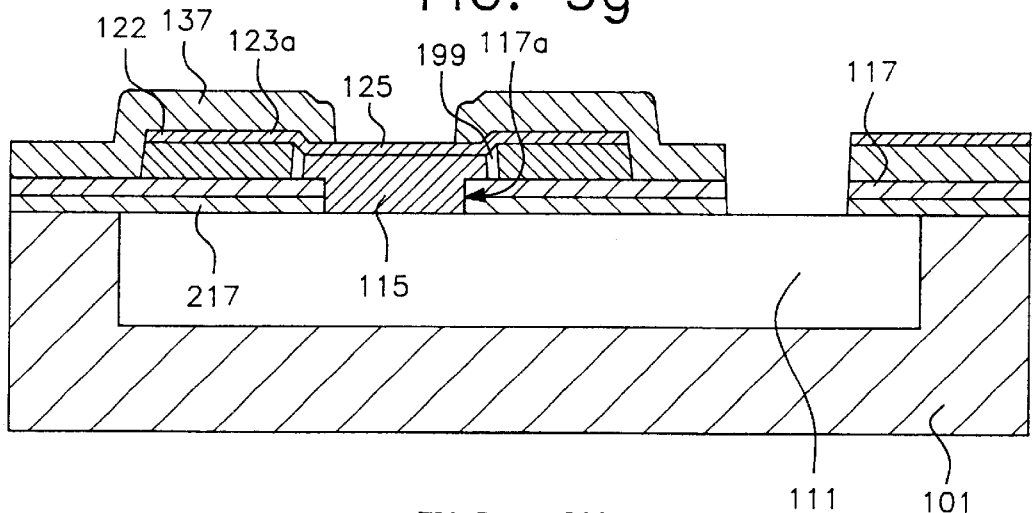

The buffer layer 122 and the base electrode layer 123 are patterned together to form a base electrode 123a and the base 125 in the form of an island. On the substrate, silicon dioxide or silicon nitride is deposited to form an emitter insulation film 137. Then, the emitter insulation film 137 covering the base 125 is patterned to open an emitter area. Meanwhile, the emitter insulation 137 and the collector insulation film 117 covering the buried collector 111 are patterned to expose a part of the buried collector 111 (FIG. 3g).

Figure 3H:
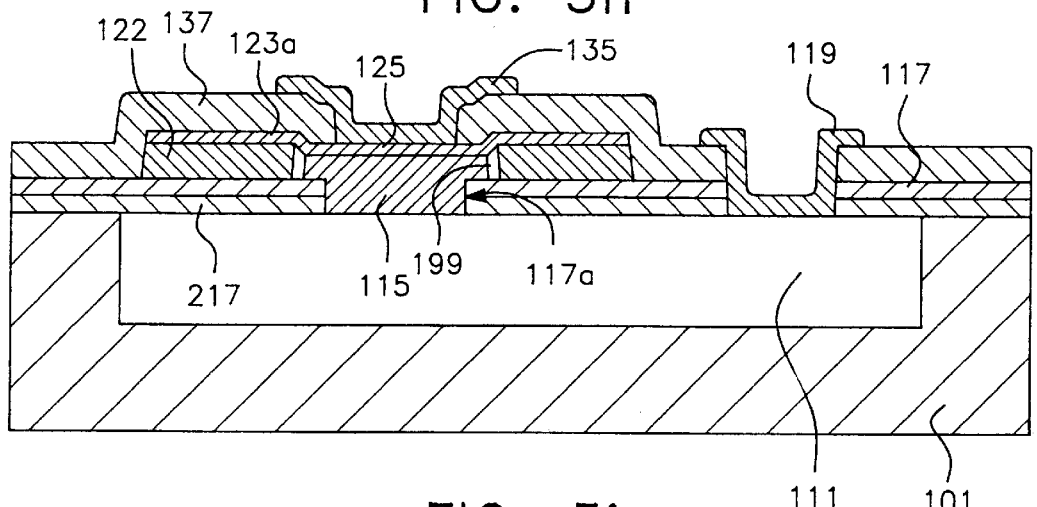

Polycrystalline n-type silicon is deposited and patterned to form an emitter 135 in the opened emitter area and a collector electrode 119 contacted with the exposed buried collector 111 (FIG. 3h).

Figure 3I:
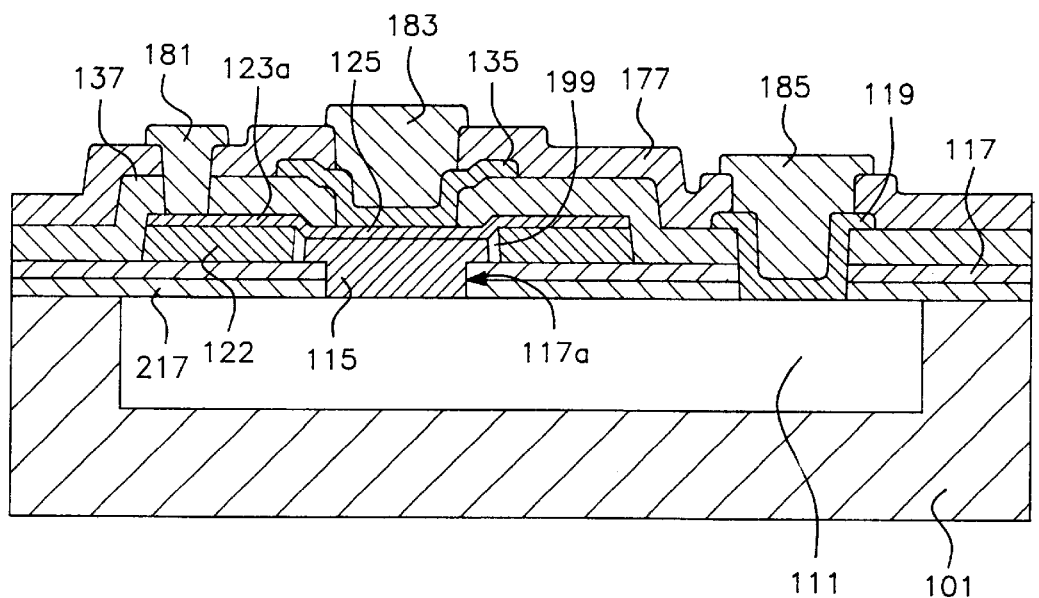

On the entire surface of the substrate, the silicon dioxide is deposited to form a protecting layer 177. The protecting layer 177 is patterned to expose the emitter 135 and the collector electrode 119. And the protecting film 177 and the emitter insulation film 137 covering the base electrode 123a are patterned to expose a part of the base electrode 123a. A metal such as Ti, W, Cu, Au, Al, Cr and so forth is sputtered and patterned to form a base terminal 181 contacted with the base electrode 123, an emitter terminal contacted with the emitter 135 and a collector terminal 185 contacted with the collector electrode 119 (FIG. 3i).

According to the present invention, the problem of the leakage current and the loading effect generated when manufacturing bipolar transistor in which the collector is formed by the SEG method are prevented. Further, since the collector is formed at an upper portion than the insulation film, though a defect lattice is generated between the collector and the insulation film, a current of the base is directed connected to the defective portion and thus the leakage current between the collector and the base is prevented, thereby improving a reliability of the product. And since the junction between the collector and base is formed to be self-aligned, an overlapped portion interposing the insulation film therebetween is prevented, thereby minimizing the junction capacitance. Thus, the intrinsic area of the device is precisely and finely formed. In addition, since the base film grows on the silicon surface of the substrate, the base film is not affected by the loading effect and formed to have a uniform thickness, thereby increasing a performance of the product.

Although the preferred embodiment of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A bipolar device, comprising:
    an insulation film disposed on a surface of a substrate and including a silicon nitride layer, said film having a collector area provided therein with a vertical sidewall;

a collector filled in the collector area and having a portion thereof protruding over the silicon nitride layer, said collector being formed into a mushroom shape;

an oxide film enclosing only the sides of the protruding portion of the collector;

a first base semiconductor electrode formed on the insulation film at a thickness corresponding to the height of the oxide film; and a base disposed in contacting relationship on the collector and having a side portion forming a second base semiconductor electrode extending over said oxide film and said first base semiconductor electrode wherein the oxide film defines the junction between the collector and the base, prevents leakage current therebetween, and minimizes the formation of parasitic capacitance across the junction.

2. The bipolar device of claim 1, wherein the substrate is a semiconductor containing a first semiconductor impurity and the insulation film is formed on a buried collector formed in the substrate, the buried collector containing a second semiconductor impurity, and wherein a part of the buried collector is exposed through the collector area prior to formation of the collector.

3. The device of claim 1, further comprising:

an emitter insulation layer covering the second base semiconductor electrode and exposing a substantial part of the base; and an emitter disposed in contact with the exposed base portion.

4. A bipolar device, comprising:

an insulation film containing silicon nitride formed on a substrate and having a part of the insulation film removed to define a collector area;

a first semiconductor material formed in the collector area by a selective epitaxial growth method to form a collector having generally the form of a mushroom with a portion thereof protruding over the insulation film;

an oxide film containing silicon dioxide formed on a sidewall surface of the collector portion protruding over the insulation film;

a second semiconductor material formed on the insulation film and having the same height as the protruding portion of the collector, the second material forming a buffer layer;

an epitaxially grown base layer containing silicon-germanium covering the collector, the oxide film and the buffer layer, said base layer forming a base on the collector and a base electrode on the buffer layer;

an emitter formed on said base; and means forming emitter, base and collector terminals contacting said emitter, base and collector;

wherein the oxide film defines the junction between the collector and the base, prevents leakage current therebetween, and thereby minimizes the formation of parasitic capacitance across the junction.

5. A bipolar device as recited in claim 4, wherein the substrate contains a first impurity and includes a buried collector area in which a first impurity is ion-implanted.

6. A bipolar device as recited in claim 4, wherein an insulating material covers the base layer and buffer layer except for an emitter opening through which said emitter is formed in contact with the base.

* * * * *